United States Patent [19]

Taddiken

[11] Patent Number: 5,286,985

[45] Date of Patent: Feb. 15, 1994

[54] INTERFACE CIRCUIT OPERABLE TO PERFORM LEVEL SHIFTING BETWEEN A FIRST TYPE OF DEVICE AND A SECOND TYPE OF DEVICE

[75] Inventor: Albert H. Taddiken, Dallas, Tex.

[73] Assignee: Texas Instruments Incorporated, Dallas, Tex.

[21] Appl. No.: 996,483

[22] Filed: Dec. 22, 1992

Related U.S. Application Data

[63] Continuation of Ser. No. 714,797, Jun. 13, 1991, abandoned, which is a continuation of Ser. No. 612,178, Dec. 17, 1990, abandoned, which is a continuation of Ser. No. 267,063, Nov. 4, 1988, abandoned.

[51] Int. Cl.$^5$ .................. H01L 29/161; H01L 29/205; H01L 29/225
[52] U.S. Cl. ..................... 257/200; 257/192; 257/262; 257/368; 257/369; 307/475
[58] Field of Search .............. 357/16, 42; 307/475; 257/192, 200, 368, 369, 392, 262

[56] References Cited

U.S. PATENT DOCUMENTS

| | | | |
|---|---|---|---|
| 4,507,846 | 4/1985 | Ohno | 357/42 |
| 4,554,569 | 11/1985 | Tove et al. | 357/42 |
| 4,654,548 | 3/1987 | Tanizawa et al. | 357/42 |
| 4,710,478 | 12/1987 | Yoder | 357/16 |
| 4,732,870 | 3/1988 | Mimura | 357/42 |
| 4,774,205 | 9/1988 | Choi et al. | 357/16 |

OTHER PUBLICATIONS

Shichijo et al, "Co-Integration of GaAs MESFET and Si CMOS Circuits", IEEE Electron Device Letters, vol. 9, No. 9, Sep. 1988.

Primary Examiner—Ngan Ngo
Attorney, Agent, or Firm—Richard A. Stoltz; James C. Kesterson; Richard L. Donaldson

[57] ABSTRACT

Interface circuits for connecting gallium arsenide circuits with silicon circuits with the interface circuits using a mix of gallium arsenide and silicon devices. Preferred embodiments (200) connect gallium arsenide buffered FET logic circuits (202) with silicon CMOS circuits with a two branch interface circuit under CMOS supply voltages with a BFL logic branch (208-210) merged with a CMOS inverter branch (204-206).

3 Claims, 5 Drawing Sheets

BFL/CMOS INTERFACE

CMOS/BFL INTERFACE

BFL/CMOS INTERFACE

CMOS/BFL INTERFACE

INTERFACE CIRCUIT OPERABLE TO PERFORM LEVEL SHIFTING BETWEEN A FIRST TYPE OF DEVICE AND A SECOND TYPE OF DEVICE

This is a continuation of application Ser. No. 07/714,797, filed on Jun. 13, 1991, now abandoned, which is a continuation of application Ser. No. 07/612,178, filed on Dec. 17, 1990, now abandoned, which is a continuation of application Ser. No. 07/267,063, filed on Nov. 4, 1988, now abandoned.

BACKGROUND OF THE INVENTION

1. Field of the Invention

The present invention relates to electronic semiconductor devices, and, more particularly, to interfaces of silicon-based and III-V-based circuits.

2. Description of the Related Art

Many researchers have investigated growth of semiconductor-device quality gallium arsenide (GaAs) on silicon wafers and fabrication of active devices in the GaAs. Such devices would combine the higher mobility of carriers in GaAs with the greater mechanical strength and thermal conductivity of a silicon substrate. For example, R. Fischer et al, GaAs/AlGaAs Heterojunction Bipolar Transistors on Si Substrates, 1985 IEDM Tech.Dig. 332, report GaAs/AlGaAs heterojunction bipolar transistors grown on silicon substrates and having current gains of $\beta = 13$ for a 0.2 $\mu$m thick base. Similarly, G. Turner et al, Picosecond Photodetector Fabricated in GaAs Layers Grown on Silicon and Silicon On Sapphire Substrates, 1985 IEDM Tech.Dig. 468, report response times of 60 picoseconds for photoconductive detectors fabricated in GaAs on silicon. H. Shichijo et al, GaAs E/D MESFET 1-kbit Static RAM Fabricated on Silicon Substrate, 8 IEEE Elec.Dev.Lett. 121 (1987) reports a static RAM in GaAs on silicon, and H. Tran et al, GaAs/AlGaAs Heterojunction Emitter-Down Bipolar Transistors Fabricated on GaAs-on-Si Substrate, 8 IEEE Elec.Dec.Lett. 50 (1987) reports a vertical heterojunction bipolar transistor in GaAs on silicon. These articles also note that majority carrier devices such as MESFETs fabricated in GaAs on silicon have performance approaching that of homoepitaxial devices; and this has encouraged efforts to integrate GaAs-based optoelectronic and high-frequency devices with high density silicon devices on the same wafer to utilize high-data-rate optical or electrical interconnections, thereby reducing the number of wire interconnections or enhancing system performance through selective use of high speed GaAs devices on silicon VLSI. In order to achieve this goal, however, it will be necessary to develop materials growth and device processing techniques that will permit the coexistance of circuit elements with vastly different fabrication requirements. One of the most promising of these approaches is the patterned growth of GaAs onto a silicon substrate through openings in a protective mask of either silicon nitride ($Si_3N_4$) or silicon dioxide ($SiO_2$). In this scheme, the fabrication of the silicon based devices (which typically require high temperature processing) would be completed prior to the deposition of a protective oxide or nitride overlayer. Single crystal GaAs could then be grown into lithographically defined holes in the overlayer, and GaAs device fabrication would follow.

Previous work has established that epitaxial GaAs can be successfully deposited onto silicon substrates through a patterning mask; see B. Y. Tsaur et al, 41 Appl Phys. Lett. 347 (1982), P. Sheldon et al, 45 Appl. Phys. Lett. 274 (1984), Daniele et al, U.S. Pat. No. 4,587,717, and Betsch et al, U.S. Pat. No. 4,551,394. In addition, the integration of Si and GaAs device structures via this technology has been demonstrated; see H. K. Choi et al, 7 IEEE Elec.Dev.Lett. 241 and 500 (1986); and H. Shichijo et al, Co-Integration of GaAs MESFET and Si CMOS Circuits, 9 IEEE Elec.Dev.Lett. 444 (1988).

The simplest avenue for the patterned growth of GaAs on Si would involve the epitaxial growth of the GaAs onto the original planar silicon surface. However, the final level of the GaAs surface where device fabrication occurs may be several microns above the the level of prefabricated silicon devices. This situation would naturally complicate the interconnect of the two device structures by conventional metallization schemes. Indeed, for integrated circuits with both digital silicon and digital GaAs devices on an underlying silicon substrate, the coplanarity between the surface of the GaAs regions and the surface of the silicon substrate is essential. One method to achieve this coplanarity is by forming recesses in the silicon substrate where the GaAs regions are to be located and then growing a GaAs layer until the surface of the GaAs in the recesses is coplanar with the surface of the silicon substrate outside of the recesses. Typically the recesses will be about two to three microns deep. FIG. 1a illustrates in cross sectional elevation view of a MESFET in a GaAs-filled recess in a silicon substrate connected to a p-channel MOSFET in a n well in the silicon substrate. FIG. 1a is heuristic and does not indicate the interface problem between GaAs circuits and silicon circuits which typically operate at different voltage levels and swings.

Hybrid circuits with GaAs and silicon circuits on seperate substrates which are wired together typically have level translation subcircuits built-in at the input and output of the GaAs circuits to provide compatibility with the silicon circuits. See for example, M. Ino et al, A 1.2 ns GaAs 4 kb Read-Only-Memory Fabricated by 0.5 $\mu$m-Gate BP-SAINT, 1987 IEEE GaAs IC Sump. 189; M. Kane, A 1.5 GHz Programmable Divide-by-N GaAs Counter, 23 IEEE J.S.S.C. 480 (1988); G. Schon et al, Fully ECL-Compatible GaAs Standard-Cell Library, 23 IEEE J.S.S.C. 677 (1988); and B. Chappell et al, Fast CMOS ECL Receivers with 100-mV Worst-Case Sensitivity, 23 IEEE J.S.S.C. 61 (1988) which has interfaces for silicon CMOS to silicon ECL. However, these level translation subcircuits must provide high-drive and have large power dissipation.

SUMMARY OF THE INVENTION

The present invention provides interface circuits for monolithically integrated circuits of different technologies with an interface employing at least one device of each technology. Preferred embodiments include silicon CMOS intefaced with GaAs MESFETs. These interface circuits solve the power dissipation problems of the known interfaces.

BRIEF DESCRIPTION OF THE DRAWINGS

The drawings are schematic for clarity.

DESCRIPTION OF THE PREFERRED EMBODIMENTS

When the GaAs and silicon technologies are monolithically integrated, it is not necessary to provide high-drive, high power dissipation interface circuitry as is required for hybrid GaAs/Si implementations where the interface circuitry must drive large capacitances associated with the chip packages and intra-board and/or board-to-board interconnections.

Figure 1A:
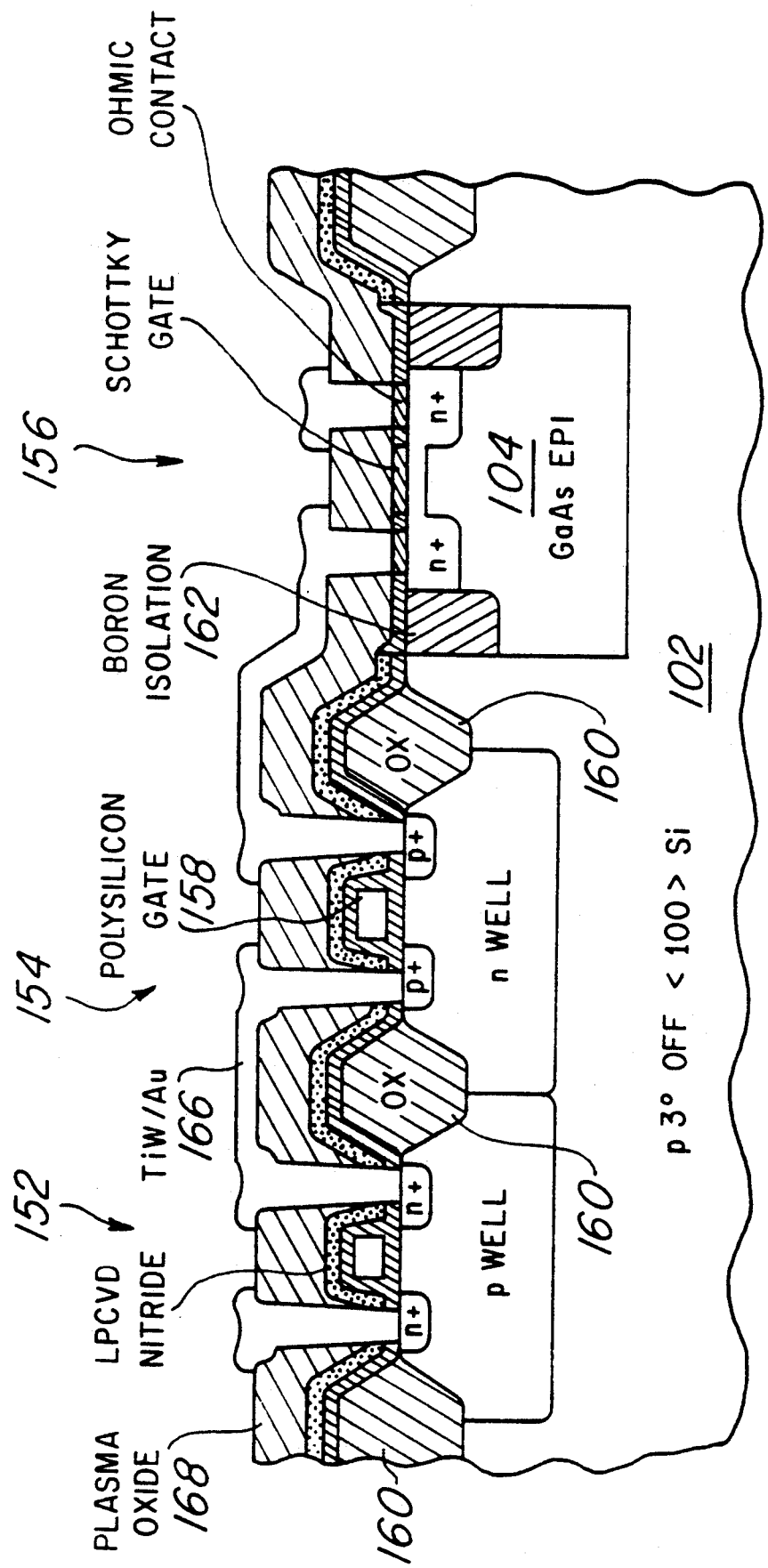
FIG. 1a-c are cross sectional elevation view of gallium arsenide and silicon devices on a common substrate and direct interfaces.
Figure 1B:
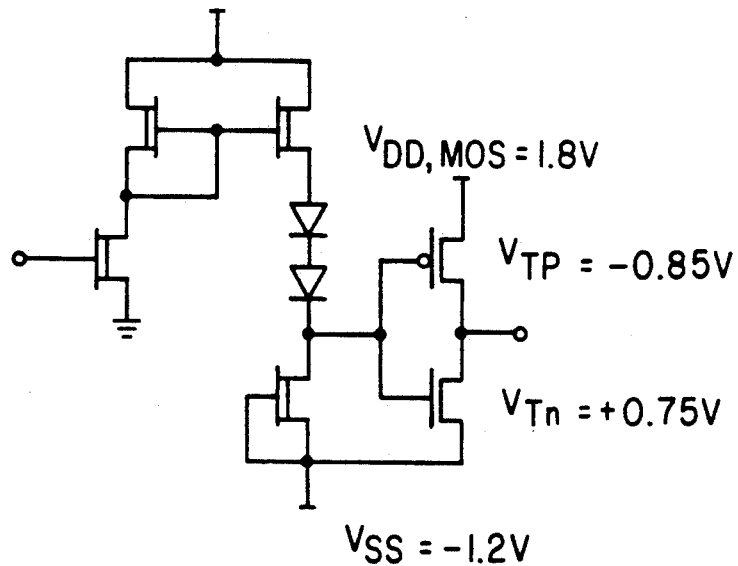
Figure 1B:
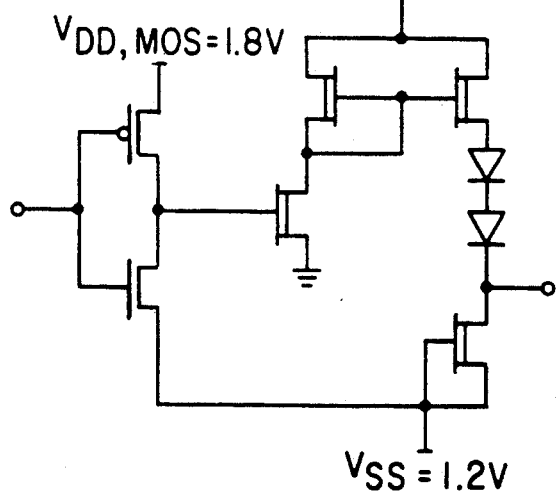

The simplest straightforward BFL/CMOS and CMOS/BFL interfaces are shown in FIG. 1b. In this configuration the CMOS ground is common with the BFL negative supply ($V_{SS}$), and the interfaces are direct-coupled BFL and CMOS inverters. It is clear that the CMOS output does not quite reach $V_{SS}$ due to incomplete cutoff of the PMOS device. This problem occurs because the BFL gate is typically operated with lower power supply voltages than the CMOS, and, therefore, the output high level of the BFL/CMOS interface is not within a PMOS threshold voltage of the CMOS power supply. If it is desired to operate the CMOS circuitry with a 5 volt supply, this problem is greatly increased, and it becomes necessary to operate the BFL circuitry with a larger positive supply voltage and, hence, power dissipation.

Figure 1C:
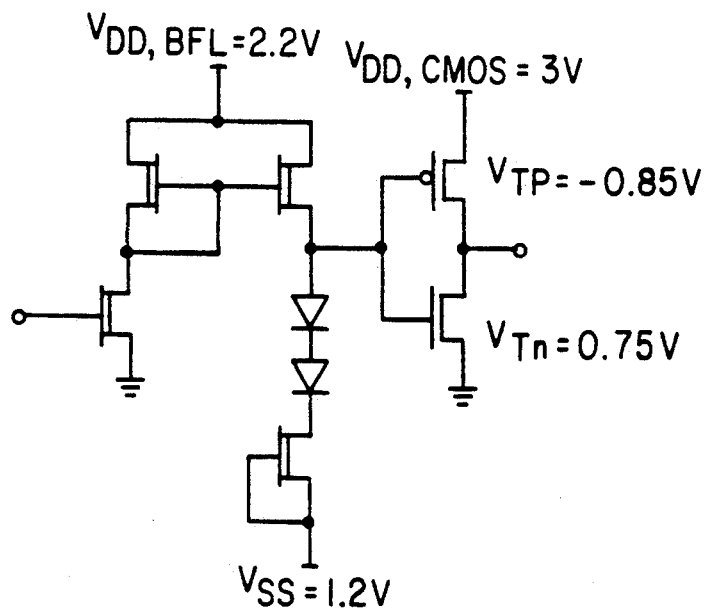
Figure 1C:
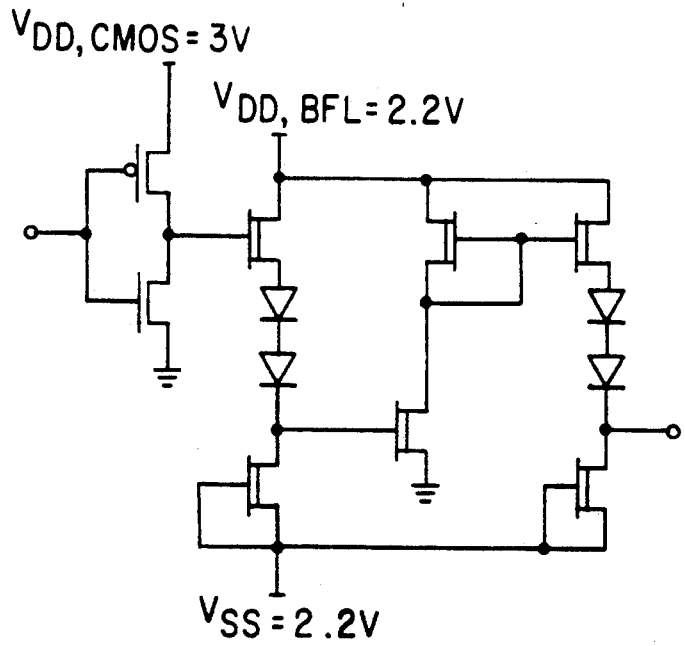

Another slightly more complex straightforward approach for BFL/CMOS and CMOS/BFL interfaces is shown in FIG. 1c. In this configuration the CMOS ground is common with the BFL ground rather than the negative supply. In the case of the BFL/CMOS interface, the output of the BFL inverter is taken from the source of the source-follower transistor (two diode drops above the output potential used in the simplest interface design), while the CMOS/BFL interface requires an additional level-shifting branch up front. As was the case for the simplest interface, it is obvious that the CMOS output does not quite reach ground due to incomplete cutoff of the PMOS device. Once again, if it is desired to operate the CMOS circuitry with a 5 volt supply, this problem is greatly increased, and it becomes necessary to operate the BFL circuitry with a larger positive supply and, hence, power dissipation.

Figure 2:
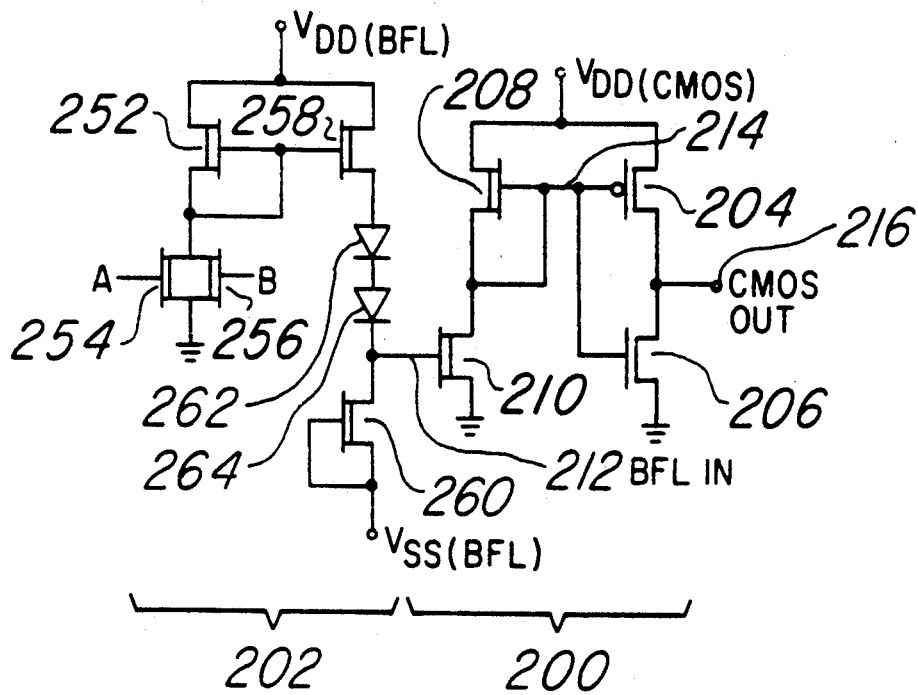
FIG. 2 is a schematic diagram of a first preferred embodiment.
Figure 3:
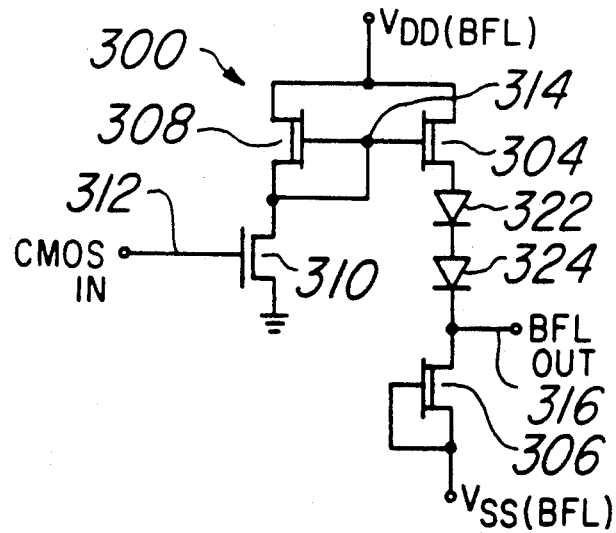
FIG. 3 is a schematic diagram of a second preferred embodiment.

The preferred embodiment BFL/CMOS and CMOS/BFL interfaces are shown in FIGS. 2 and 3. In this configuration the CMOS ground is common with the BFL ground. In the case of the BFL/CMOS interface the output of the BFL inverter drives a second GaAs switching branch which is connected to the CMOS power supply, while the CMOS/BFL interface utilizes an NMOS switching device in place of a GaAs D-MESFET to prevent the previous CMOS output from clamping into the Schottky diode of the GaAs device. These interface designs allow any combination of GaAs and Si power supply voltages to yield functional circuits with large noise margins. Thus, the BFL circuits can be operated with low supply voltages to avoid wasted power dissipation, while the CMOS circuits are operated with the fun 5 volt supply to provide sufficient electric field for reasonable carrier velocities and thus circuit performance. Another potential benefit of this interface configuration is that the output node of the preceding gate may also be used to drive a gate of its own technology, as well as the interface circuit and hence other technology. Therefore, this interface scheme maintains a considerable flexibility advantage, over the two straightforward approaches discussed supra, since the designer has more freedom in choice of power supply voltages and can use the internal nodes of the interfaces to drive to both technologies (i.e. the interfaces in effect provide fanout capability to drive either technology while the two straightforward interface designs cannot). First preferred embodiment interface circuit is schematically illustrated in FIG. 2 as is generally denoted by reference numeral 200. Interface circuit 200 converts the output of GaAs Buffered FET Logic (BFL) circuitry to the input of silicon CMOS circuitry and includes silicon p-channel MOSFET 204, silicon n-channel MOSFET 206, GaAs depletion mode MESFET (D-MESFET) 208, and GaAs D-MESFET 210: the silicon MOSFETs 204–206 are both enhancement mode FETs. Silicon MOSFETs 204–206 are connected as a CMOS inverter, and the GaAs MESFETs 208–210 are connected as part of a BFL inverter (load device 208 and switching device 210); but the supply voltages are the usual silicon CMOS supply voltages of $V_{DD(CMOS)}$ (5 volts) and ground. Contrarily, the BFL supply voltages are $V_{DD(BFL)} = 2.2$ volts, ground and $V_{SS(BFL)} = -1.2$ volts. BFL NOR gate 202 in FIG. 2 is exemplary only and illustrates the characteristic of BFL: a gate has two branches, a logic branch (MESFETs 252, 254, 256) and a level shifter branch which includes Schottky diodes (MESFETs 258 and 260 and diodes 262 and 264). Note that this choice of supply voltages is optimal for BFL in that greater voltages will consume more power without significant increase in switching speed, and smaller voltages will degrade noise margins.

The threshold/turnoff voltages for the FETs 204, ..., 210 are as follows: $-0.85$ volt for p-channel 204, $+0.75$ volt for n-channel 206, and $-0.7$ volt for D-MESFETs 208 and 210. The BFL logic swing is from a low of $-1.0$ volt to a high of 0.6 volt, and the CMOS logic swing is from a low of 0 volts to a high of 5 volts. Thus a high BFL input at node 212 of 0.6 volt will turn on D-MESFET 210 hard and pull node 214 down to about 0.1 volt which will turn off n-channel 206 and turn on p-channel 204 ($V_{GS} = 0.1-5.0 = -4.9$, which is more negative than the threshold of $-0.85$) and provide an output at node 216 of 5 volts.

Conversely a low BFL input at node 212 of $-1.0$ volt will turn off D-MESFET 210 and load D-MESFET 208 win pull up node 214 to about 5 volts which will turn on n-channel 206 and turn off p-channel 204 and provide an output at node 216 of 0 volts. In short, the BFL logic swing from $-1.0$ volt to 0.6 volt has been converted to full CMOS logic swing from 0 volts to 5 volts by using the CMOS supply voltage across the D-MESFET 208–210 inverter. This provides full signal swing at the CMOS output and yields faster switching speed and full CMOS noise margins.

Second preferred embodiment interface circuit is schematically illustrated in FIG. 3 as is generally denoted by reference numeral 300. Interface circuit 300 converts the output of silicon CMOS circuitry to the input of GaAs BFL circuitry and includes GaAs D-MESFET 304. GaAs Schottky diodes 322 and 324, GaAs D-MESFET 306, GaAs load D-MESFET 308, and silicon switch n-channel MOSFET 310. Silicon n-channel MOSFET 310 and GaAs D-MESFET 308 are connected as an inverter, with supply voltages of $V_{DD(BFL)}$ (the usual GaAs BFL supply high voltage of 2.2 volts) and ground.

Contrarily, D-MESFETs 304 and 306 are in series together with Schottky diodes 322 and 324 between the usual BFL supply voltages of $V_{DD(BFL)}=2.2$ volts and $V_{SS(BFL)}=-b\ 1.2$ volts for the usual BFL level shifting. The threshold voltages for the FETs 304, . . . , 310 are as follows: +0.75 volt for n-channel 310, and −0.7 volt for D-MESFETs 304, 306, and 308; and the Schottky diodes 322 and 324 also have turn on voltages of about 0.7 volts. Thus a high CMOS input at node 312 of 5 volts will turn on n-channel 310 and pun node 314 down to about 0 volts which is level shifted by the two diodes 322 and 324 yielding the output at node 316 of −1.0 volt. Conversely, a low CMOS input at node 312 of 0 volts will turn off n-channel 310 and load D-MESFET 308 will pull up node 314 to about 2.2 volts which is level shifted to yield an output of 0.6 volts due to clamping by the succeeding BFL gate. In short, the CMOS logic swing from 0 volts to 5 volts has been converted to BFL logic swing from −1.0 volt to 0.6 volt by using the BFL supply voltages across the D-MESFET and diode 304-322-324-306 level shifter. This also prevents the preceding CMOS gate from clamping by gate conduction into the interface circuit as it would if a GaAs MESFET were used in place of silicon MOSFET 310. This stops the CMOS gate from dissipating power when in the static state with input to the interface circuit of a logic high.

The transistors and diodes in interfaces 200 and 300 have the following sizes: p-channel 204 has a gate length of 2 μm and width of 24 μm; n-channel 206 has a gate length of 2 μm and width of 8 μm, n-channel 310 has a gate length of 2 μm and width of 44 μm; MESFETs 208 and 308 have a gate length of 1 μm and width of 12 μM; MESFETs 210, 304 and 306 have a gate length of 1 μm and width of 20 μm; and Schottky diodes 322 and 324 are 20 μm by 1 μm.

The monolithic integration process of both silicon and GaAs devices including interfaces 200 and 300 begins with a [100] p-type silicon substrate nominally oriented 3–4 degrees toward [011] and first fabricates silicon CMOS devices using a conventional twin-well 2 micron CMOS process with 350 Å thick gate oxide and polysilicon gates. After the n+ and p+ source/drain implantation and anneal, the wafer is covered with protective layers of silicon oxide/silicon nitride/silicon oxide. The nitride layer is inserted to deter gallium diffusion during the subsequent MBE growth of the GaAs. Next, photolithographically defined windows are etched down to the underlying silicon substrate, and the windowed oxide/nitride/oxide then is used as an etch mask for etching 3 micron deep recesses in the silicon with $HBr/O_2/SiF_4$ RIE.

After a clean-up of the exposed silicon surfaces, the wafer is immediately loaded into an MBE machine and the native oxide on the exposed silicon is desorbed by heating the substrate to 975 C. for five minutes. GaAs is then grown with a conventional two step process: initially slow growth at 475 C. followed by growth at 525 C. The GaAs is grown to a thickness of 3 microns with the surface region having a 0.15 micron thick n-type channel layer followed by a 0.1 micron thick n+-type cap layer. After the MBE growth the GaAs deposited over the oxide/nitride/oxide is removed by lift-off.

Lastly, GaAs MESFETs are fabricated using a conventional recessed 1 micron long gate process with TiPtAu for Schottky metal and Au-GeNi for ohmic metal. The MESFETs are isolated by boron lattice damage implants. After MESFET fabrication, the entire wafer is covered with plasma oxide followed by the formation of two levels of meal interconnection using TiW/Au to connect the silicon and GaAs devices.

Because interfaces 200 and 300 are fabricated as part of the silicon and GaAs device fabrication, the particular transistor characteristics (e.g., gate length, gate width, channel doping levels, etc.) of the MOSFETs and D-MESFETs of interfaces 200 and 300 depend upon the characteristics of the transistors of the other circuitry.

Figure 4:
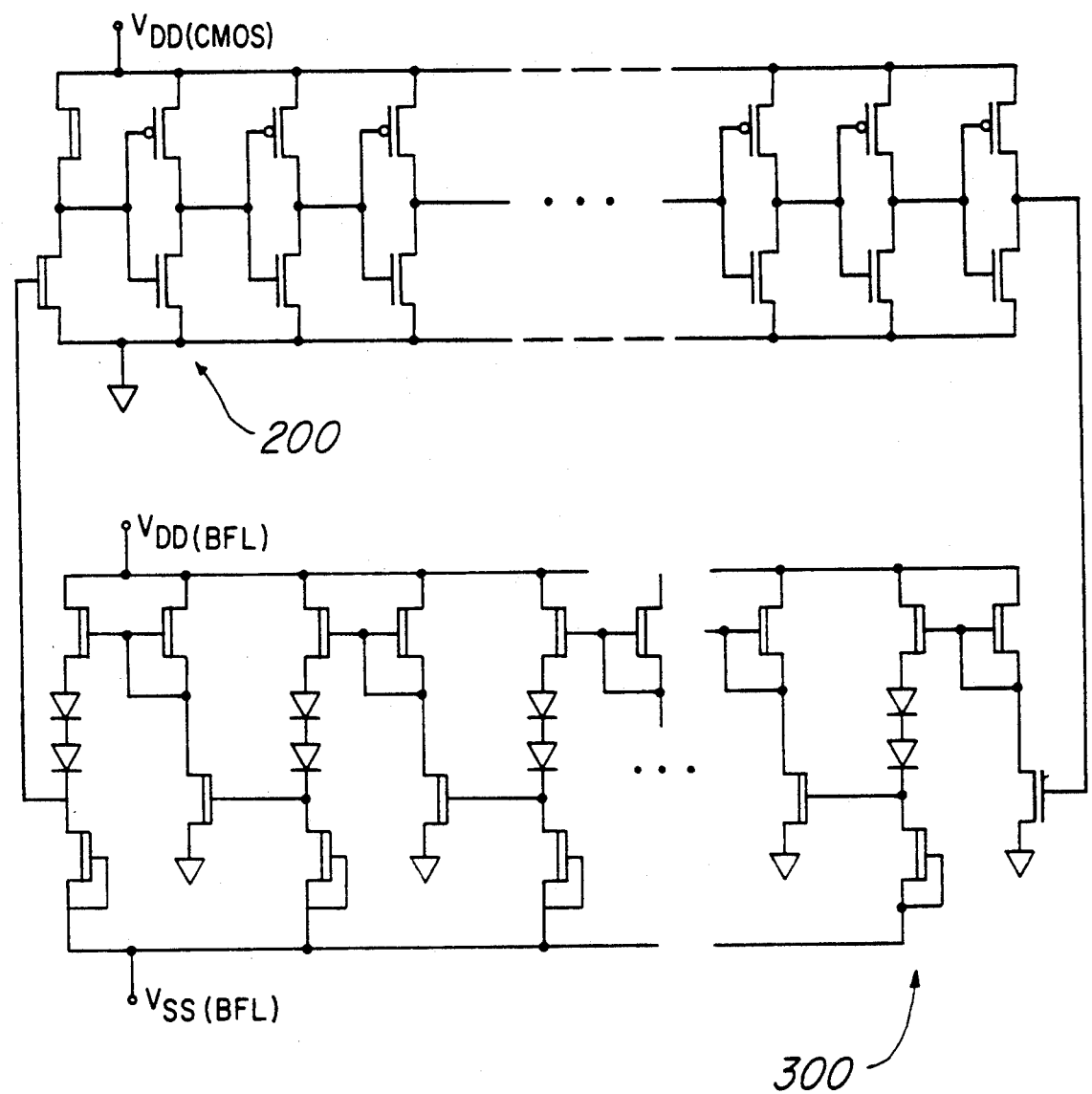
FIG. 4 is a circuit including the first and second preferred embodiments.

A comparison of the simulated performance of the first and second preferred embodiment interfaces and the two straightforward interface pairs in a ring oscillator circuit consisting of 35 CMOS stages, a CMOS/BFL interface, 12 GaAs BFL stages, and a BFL/CMOS interface as shown in FIG. 4 appears in the following Table:

| Interfaces | Monolithic Ring Oscillator Periods | | |
|---|---|---|---|
| | FIG. 1b | FIG. 1c | 200 + 300 |
| Nominal 3 V | 8.19 ns | 82.0 ns | * |
| | 55.3 mW (A) | 58.9 mW (B) | |
| Nominal 5 V | 38.3 ns | 45.4 ns | 45.5 ns |
| | 140.1 mW (C) | 150.0 mW (D) | 52.7 mW (E) |

*Simulation not performed since full 5 V can be applied to CMOS without penalty [see (E)]
Nominal CMOS thresholds are $V_{TNMOS} = +0.75$ V and $V_{TPMOS} = -0.80$ V (A) Vdd,bfl = +2.20 V  
    Vss,bfl = −1.20 V  
    Vdd,cmos = +1.80 V  
    Vss,cmos = −1.20 V  
(B) Vdd,bfl = +2.20 V  
    Vss,bfl = −1.20 V  
    Vdd,cmos = +3.00 V  
    Vss,cmos = 0.00 V  
(C) Vdd,bfl = +3.00 V  
    Vss,bfl = −2.00 V  
    Vdd,cmos = +3.00 V  
    Vss,cmos = −2.00 V  
(D) Vdd,bfl = +3.00 V  
    Vss,bfl = −2.00 V  
    Vdd,cmos = +5.00 V  
    Vss,cmos = 0.00 V  
(E) Vdd,bfl = +2.20 V  
    Vss,bfl = −1.20 V  
    Vdd,cmos = +5.00 V  
    Vss,cmos = 0.00 V The power-delay product of the ring oscillator using the novel interface is much better (lower) than for either of the simpler interface designs because the CMOS uses a full 5 volt supply rather than only 3 volts. The novel, mixed- technology interfacing scheme presents the best combination of I/O level compatibility, power dissipation, speed, and flexibility.

MODIFICATIONS AND ADVANTAGES

Various modifications of the preferred embodiment devices and methods may be made while retaining the features of an interface made of devices of both technologies. For example, BFL may be replaced by Direct-Coupled FET Logic (DCFL) by just substituting an enhancement mode MESFET for the depletion mode switching MESFET (210), by substituting the DCFL supply voltage Vdd,dcfl for the BFL supply Vdd,bfl, and by eliminating devices 304, 322, 324, and 306 and using node 314 in place of 316 as the DCFL output. Similarly, Schottky Diode FET Logic (SDFL) or Static Feed-Forward Logic (SFFL) may be used in place of BFL by eliminating device 304 and directly connecting node 314 to the positive terminal of the diode (322). Further, other material systems could be used such as InP on silicon.

What is claimed is:

1. An interface circuit between first and second types of devices, said interface circuit operable to perform level shifting of first signals generated by said first type of device to second signals compatible with said second type of device, said interface comprising:
   (a) a first series path comprising at least two devices of a first type including two MESFETs in series either between a common bias supply and ground or between said common bias supply and a second bias supply; and
   (b) a second series path comprising, either a third MESFET of said first type or a p-channel MOSFET of said second type and an n-channel MOSFET of said second type in series between said common bias supply and ground.

2. The interface circuit of claim 1, wherein:
   (a) said MOSFETs are formed principally of silicon; and
   (b) said MESFETs are formed principally of GaAs.

3. The interface circuit of claim 1, wherein:
   (a) said first series path includes two GaAs MESFETs in series between said common bias supply and a second bias supply; and
   (b) said second series path type includes a silicon n-channel MOSFET in series with said GaAs third MESFET between said common bias supply and ground.

* * * * *